(12) United States Patent
Banerjee

(10) Patent No.: US 6,621,404 B1
(45) Date of Patent: Sep. 16, 2003

(54) LOW TEMPERATURE COEFFICIENT RESISTOR

(75) Inventor: Robindranath Banerjee, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/002,413

(22) Filed: Oct. 23, 2001

(51) Int. Cl.[7] ............................................. H01C 7/06
(52) U.S. Cl. ................................. 338/7; 338/8; 338/9
(58) Field of Search .................................... 338/7, 8, 9

(56) References Cited

U.S. PATENT DOCUMENTS

| | | | | |
|---|---|---|---|---|
| 4,104,607 A | * | 8/1978 | Jones | 338/309 |
| 4,229,502 A | * | 10/1980 | Wu et al. | 338/9 |
| 5,039,976 A | * | 8/1991 | Drabkin | 338/314 |
| 6,097,276 A | * | 8/2000 | Van Den Broek et al. | 338/9 |
| 6,211,769 B1 | * | 4/2001 | Baldwin et al. | 338/7 |
| 2002/0038883 A1 | * | 4/2002 | Lowrey et al. | 257/314 |

FOREIGN PATENT DOCUMENTS

JP   63-273347   * 11/1988

* cited by examiner

Primary Examiner—Karl D. Easthom
(74) Attorney, Agent, or Firm—Luedaka, Neely & Graham

(57) ABSTRACT

A resistor having a desired temperature coefficient of resistance and a total electrical resistance. A first resistor segment has a first temperature coefficient of resistance and a first electrical resistance. A second resistor segment has a second temperature coefficient of resistance and a second electrical resistance. The first resistor segment is electrically connected in series with the second resistor segment, and the total electrical resistance equals a sum of the first electrical resistance and the second electrical resistance. The desired temperature coefficient of resistance is determined at least in part by the first temperature coefficient of resistance and the first electrical resistance of the first resistor and the second temperature coefficient of resistance and the second electrical resistance of the second resistor. Thus, in this manner the desired temperature coefficient of resistance of the resistor can be tailored to a desired value by selecting the resistance and temperature coefficients of resistance of the first and second resistor segments that are connected in series. The desired temperature coefficient of resistance can selectively be a positive value, a negative value, or a zero value, depending upon the selection of the material and the resulting resistance values and temperature coefficient of resistance values for the first and second resistor segments.

10 Claims, 4 Drawing Sheets

(section I-I)

(section I-I)

LOW TEMPERATURE COEFFICIENT RESISTOR

FIELD

This invention relates to the field of integrated circuit manufacturing. More particularly the invention relates to fabricating integrated circuit resistors having a desired temperature coefficient of resistance.

BACKGROUND

Precision resistors are critical components in applications such as analog and mixed signal integrated circuits. Reducing the variation of the resistance values of precision resistors over the operational temperature range is critical to maintaining the stability of an analog or mixed signal circuit. Prior resistors have not provided the desired temperature stability.

What is needed, therefore, is a resistor having a desired variation in resistance over temperature. Also needed is method for fabricating such a resistor without significantly increasing the complexity of the manufacturing process in which it is formed.

SUMMARY

The above and other needs are met by a resistor having a desired temperature coefficient of resistance and a total electrical resistance. A first resistor segment has a first temperature coefficient of resistance and a first electrical resistance. A second resistor segment has a second temperature coefficient of resistance and a second electrical resistance. The first resistor segment is electrically connected in series with the second resistor segment, and the total electrical resistance equals a sum of the first electrical resistance and the second electrical resistance. The desired temperature coefficient of resistance is determined at least in part by the first temperature coefficient of resistance and the first electrical resistance of the first resistor and the second temperature coefficient of resistance and the second electrical resistance of the second resistor.

Thus, in this manner the desired temperature coefficient of resistance of the resistor can be tailored to a desired value by selecting the resistance and temperature coefficients of resistance of the first and second resistor segments that are connected in series. The desired temperature coefficient of resistance can selectively be a positive value, a negative value, or a zero value, depending upon the selection of the material and the resulting resistance values and temperature coefficient of resistance values for the first and second resistor segments.

In various preferred embodiments of the resistor, the first segment is an unsilicided polysilicon resistor with a negative temperature coefficient of resistance, and the second segment is a silicided polysilicon layer with a positive temperature coefficient of resistance. The electrical resistance of the first segment is preferably related to the electrical resistance of the second segment according to:

$$\frac{R_1}{R_2} = \left|\frac{TCR_2}{TCR_1}\right|,$$

where $R_1$ is the first electrical resistance of the first segment, $R_2$ is the second electrical resistance of the second segment, $TCR_1$ is the negative temperature coefficient of resistance of the first segment, and $TCR_2$ is the positive temperature coefficient of resistance of the second segment.

Since the first and second segments of the resistor have complementary temperature coefficients of resistance, one negative and one positive, the variation in the values $R_1$ and $R_2$ over temperature are likewise complementary. The total resistance of the resistor $R_T$ is the sum of $R_1$ and $R_2$. Thus, the invention provides a resistor having a total resistance $R_T$, which preferably remains substantially constant over a wide temperature range.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
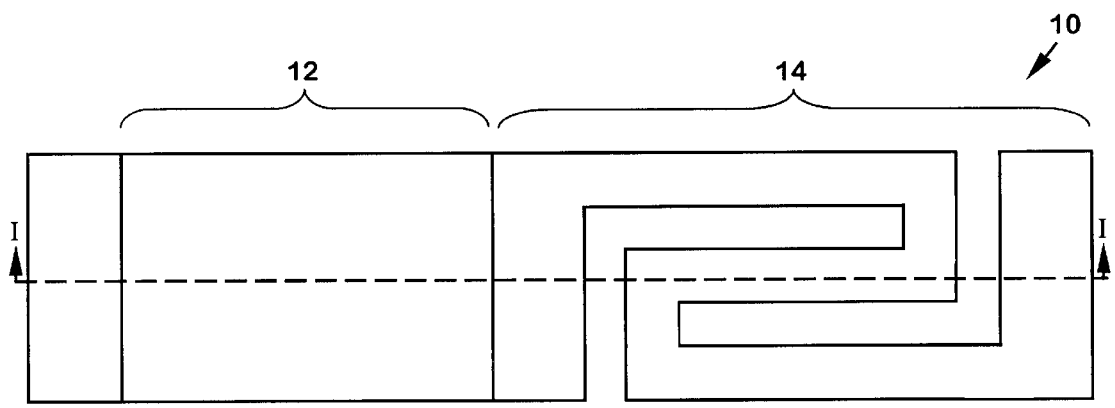
FIG. 1 is a top plan view of a resistor according to a preferred embodiment of the present invention.
Figure 2:
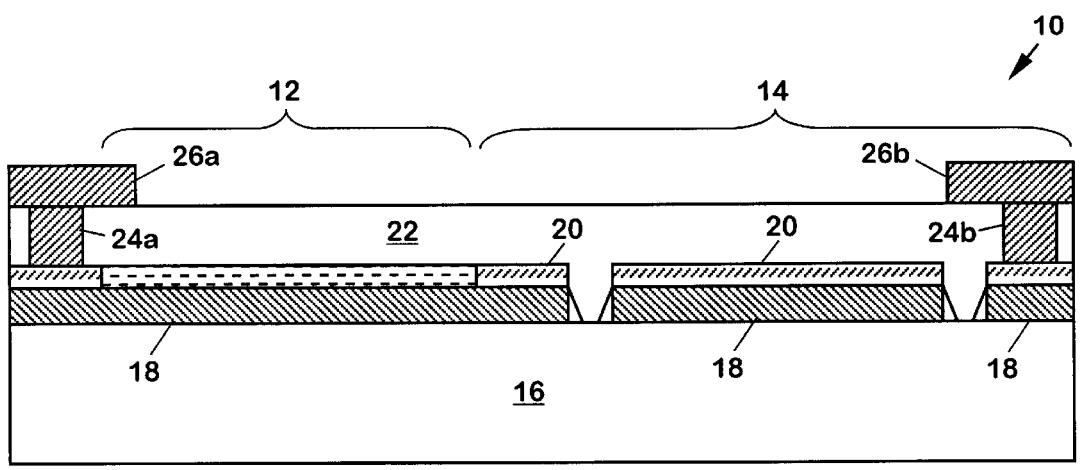
FIG. 2 is a cross sectional view of the resistor according to a preferred embodiment of the present invention.

Referring now to FIGS. 1 and 2, there are depicted a top plan view and a cross sectional view respectively of a resistor 10. In the preferred embodiment of the invention, the resistor 10 includes two segments, referred to herein as a first segment 12 and a second segment 14. As shown in FIG. 2, the segments 12 and 14 are preferably formed on a substrate 16, which is most preferably silicon, but which could be another semiconductor material, such as gallium arsenide or germanium, or may be an electrically insulating material. Thus, the embodiment as depicted in FIG. 2 is one in which the resistor 10 is formed as a part of an integrated circuit. The present invention has particular benefits when applied to integrated circuits, as the resistor 10 can be formed as a part of a standard CMOS process flow, and can be formed to have a zero temperature coefficient of resistance.

Overlying the substrate 16 is a layer of polycrystalline silicon, also referred to herein as the polysilicon layer 18. Although the invention as described herein is a preferred embodiment in which a polycrystalline silicon layer 18 is used, it is appreciated that the resistor segments as described below can be formed of other materials, having resistances and temperature coefficients of resistance that are selected to produce in combination the desired characteristics of the resistor 10, as described in more detail below.

By a process described below, the shapes of the two resistor segments 12 and 14 are defined in the polysilicon layer 18. As depicted in FIG. 1, the shape of the first segment 12 is preferably substantially rectangular and the shape of the second segment 14 is preferably substantially serpentine. It is appreciated however, that the scope of the invention is not limited to any particular shape of the first or second resistor segments 12 and 14. In the preferred embodiment, the polysilicon of at least the first segment 12 is p doped, such as by implantation of electropositive ions. The polysilicon of the second segment 14 may also be p doped, but not necessarily. Further, the polysilicon layer 18 may also be n doped.

The polysilicon layer 18 is preferably doped to a degree such that there is some conduction of electricity through the polysilicon layer 18. However, the polysilicon layer 18 is preferably not so heavily doped as to make it too conductive. In other words, it is a purpose of the polysilicon layer 18 to function as a resistor, with a resistance that is preferably at least somewhat greater than the electrically conductive elements to which it may be electrically connected, rather than as an electrical conductor with a resistance that is less than that of the electrical structures to which it may be electrically connected.

As depicted in FIG. 2, the second segment 14 is preferably covered by a silicide layer 20, the formation of which is described below. The first segment 12 preferably does not include a silicide layer that substantially completely overlies the first segment 12, although it may have contacts that include a silicide layer. Thus, the second segment 14 is also referred to herein as the silicided segment, and the first segment 12 is also referred to as the unsilicided segment.

As shown in FIG. 2, the resistor segments 12 and 14 are preferably covered by an insulating layer 22, which is most preferably a silicon oxide, such as silicon dioxide, but may also be a low k material. Electrical conductors 26a and 26b are provided on top of the oxide layer 22 for making electrical connection to the first and second segments 12 and 14 by way of electrically conductive vias 24a and 24b. Preferably, the conductors 26a and 26b are formed of metal, such as aluminum or copper. The vias 24a and 24b are also preferably formed of metal, such as tungsten. It is appreciated that the scope of the invention is not limited to any particular configuration or material of the conductors 26a–b or the vias 24a–b.

Figure 3:
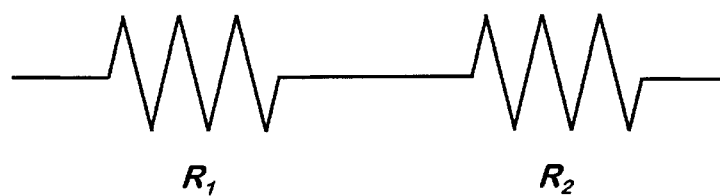
FIG. 3 is an equivalent circuit schematic diagram of the resistor according to a preferred embodiment of the present invention.

Depicted in FIG. 3 is a schematic diagram of an equivalent circuit of the resistor 10, wherein the resistance of the first segment 12 is represented by the resistance value $R_1$, and the resistance of the second segment 14 is represented by the resistance value $R_2$. Although the resistor 10 may include other contributors to its overall resistance, such as the resistances of the vias 24a and 24b and the conductors 26a and 26b, these other resistances are considered negligible compared to the values $R_1$ and $R_2$. Thus, the total resistance $R_T$ of the resistor 10 may be expressed as:

$$R_T = R_1 + R_2. \tag{1}$$

Typically, the resistivity of a semiconductor material, such as polysilicon, varies somewhat with temperature. The degree to which the resistivity of a material varies with temperature is typically expressed by the temperature coefficient of resistance of the material, which may be given in units of parts per million per centigrade (ppm/C) or percent per centigrade (%/C). Generally, the temperature coefficient of resistance is a positive number if the resistivity of a material increases with increasing temperature, and is a negative number if the resistivity of a material decreases with increasing temperature.

Using the temperature coefficient of resistance, the resistance value $R_1$ for the first segment 12 may be expressed as:

$$R_1 = R_{ref1} \times \left(1 + \left(\Delta T \times \frac{TCR_1}{10^6}\right)\right), \tag{2}$$

where, $R_{ref1}$ is the resistance of the first segment 12 at a reference temperature (such as twenty-five centigrade), $\Delta T$ is the difference between the reference temperature and the operational temperature of the resistor 10 in centigrade, and $TCR_1$ is the temperature coefficient of resistance of the first segment 12 in parts per million per centigrade. If a structure has an effective temperature coefficient of resistance that is substantially equal to zero, then as seen from equation 2 above, the resistance of the structure is not dependant upon temperature.

Similarly, the resistance value $R_2$ for the second segment 14 may be expressed as:

$$R_2 = R_{ref2} \times \left(1 + \left(\Delta T \times \frac{TCR_2}{10^6}\right)\right), \tag{3}$$

where, $R_{ref2}$ is the resistance of the second segment 14 at the reference temperature, and $TCR_2$ is the temperature coefficient of resistance of the second segment 14 in parts per million per centigrade.

According to a most preferred embodiment of the invention, the relationship between the resistance values $R_{ref1}$ and $R_{ref2}$ at the reference temperature is expressed by:

$$\frac{R_{ref1}}{R_{ref2}} = \left|\frac{TCR_2}{TCR_1}\right|. \tag{4}$$

Based on equations (1) and (4), the total resistance of the resistor 10 at the reference temperature may be expressed by:

$$R_T = R_{ref2} \times \left(\left|\frac{TCR_2}{TCR_1}\right| + 1\right). \tag{5}$$

Thus, for a given value of total resistance $R_T$, the values of $R_{ref1}$ and $R_{ref2}$ may be determined according to:

$$R_{ref2} = \frac{R_T}{\left(\left|\frac{TCR_2}{TCR_1}\right| + 1\right)}, \quad \text{and} \tag{6}$$

$$R_{ref1} = R_T - R_{ref2}. \tag{7}$$

According to the invention, the temperature coefficient of resistance $TCR_2$ of the silicided segment 14 is a positive value, such as about three thousand ppm/C, and the temperature coefficient of resistance $TCR_1$ of the unsilicided segment 12 is a negative value, such as about negative five hundred ppm/C.

For a given value of total resistance $R_T$ of about one thousand ohms, for example, using the exemplary values of $TCR_1$ and $TCR_2$ provided above, the values $R_{ref1}$ and $R_{ref2}$ may be determined using equations (6) and (7):

$$R_{ref2} = \frac{R_T}{\left(\left|\frac{TCR_2}{TCR_1}\right|+1\right)} = \frac{1000}{\left(\left|\frac{3000}{-500}\right|+1\right)} = 142.9 \text{ ohms} \quad (8)$$

$$R_{ref1} = R_T - R_{ref2} = 1000 - 142.9 = 857.1 \text{ ohms} \quad (9)$$

At an operating temperature other than the reference temperature, the values $R_1$, $R_2$, and $R_T$ may be determined using equations (2), (3), and (1). For example, if the reference temperature is twenty-five degrees centigrade and the operating temperature is one hundred and twenty-five degrees centigrade, the values $R_1$, $R_2$, and $R_T$ may be determined according to:

$$R_1 = R_{ref1} \times \left(1 + \left(\Delta T \times \frac{TCR_1}{10^6}\right)\right) =$$

$$857.1 \times \left(1 + \left((125-25) \times \frac{-500}{10^6}\right)\right) = 814.2 \text{ ohms,}$$

$$R_2 = R_{ref2} \times \left(1 + \left(\Delta T \times \frac{TCR_2}{10^6}\right)\right) =$$

$$142.9 \times \left(1 + \left((125-25) \times \frac{3000}{10^6}\right)\right) = 185.8 \text{ ohms,}$$

and $$R_T = R_1 + R_2 = 814.2 + 185.8 = 1000 \text{ ohms.}$$

Thus, the resistance values $R_1$ and $R_2$ at temperatures other than the reference temperature are different from their values at the reference temperature. However, since the temperature coefficients of resistance of the silicided and unsilicided segments 14 and 12 are complementary, the variation in the values $R_1$ and $R_2$ over temperature are also complementary. In this manner, the invention provides a resistor 10 having a total resistance $R_T$ which remains substantially constant over a temperature range in which the temperature coefficients of resistance remain substantially constant. In other words, the effective temperature coefficient of resistance for the entire structure is effectually zero, freeing the effective resistance of the structure from its dependence on temperature.

Referring now to FIGS. 4–10, the steps of a process for fabricating the resistor 10 according to a preferred embodiment of the invention are generally depicted. Described below are the major steps in the process according to the invention. Other steps not described in detail herein may also be required to complete the processing, such as photoresist removal and rinsing steps.

Figure 4:
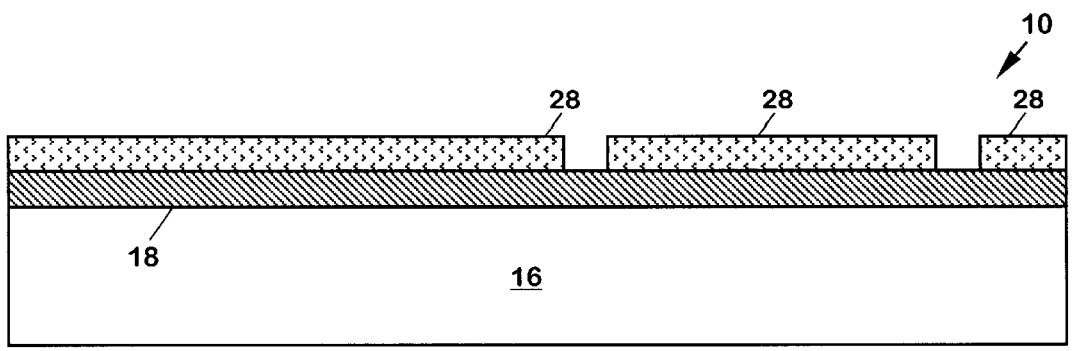
FIG. 4 depicts a masking step according to a preferred embodiment of the present invention.

As shown in FIG. 4, the substrate 16, such as silicon, is provided (step 200 in FIG. 10), and the polysilicon layer 18 is formed thereon (step 202). The polysilicon layer 18 may be formed by various processes, such as sputtering or low pressure chemical vapor deposition. In the preferred embodiment, a mask layer 28, such as a photoresist material, is applied over the polysilicon layer 18, and is patterned (step 204). Preferably, the mask layer 28 is patterned according to standard photolithography processing to leave mask material over portions of the layer 18 which are to remain after completion of the etching step described below. The polysilicon layer 18 is preferably formed substantially simultaneously with the formation of polysilicon gate structures in a standard CMOS process flow. Thus, no additional steps are required to form the polysilicon layer 18 in a standard CMOS process flow. Instead, the only change that is needed is in mask design.

Figure 5:
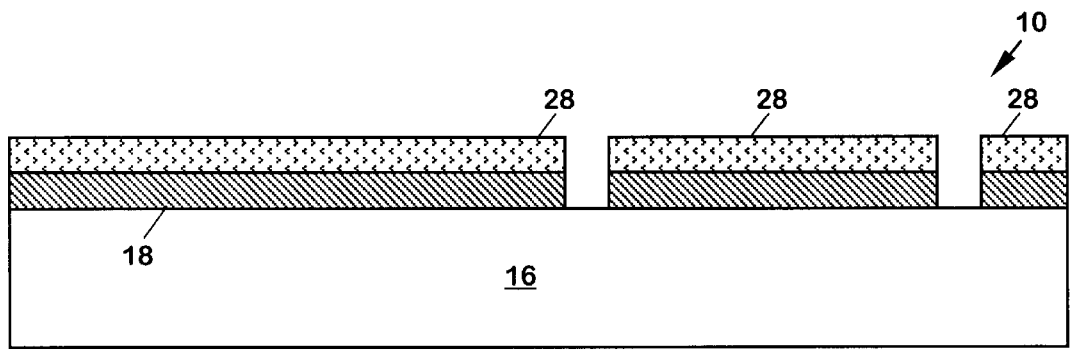
FIG. 5 depicts an etching step according to a preferred embodiment of the present invention.
Figure 6:
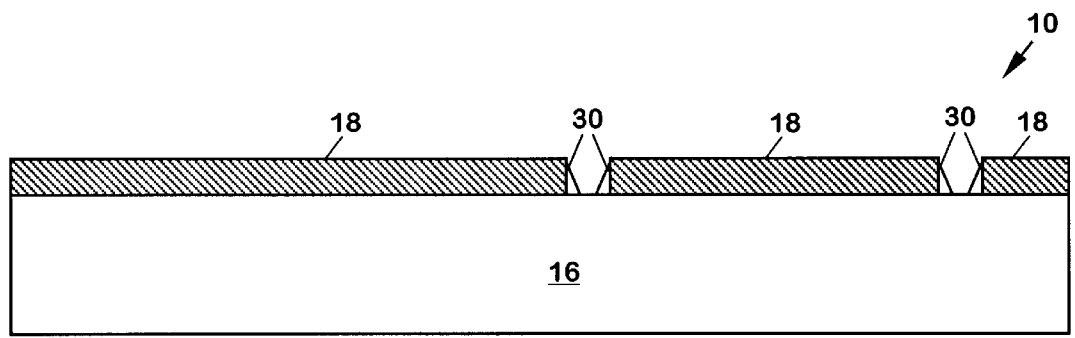
FIG. 6 depicts a spacer formation step according to a preferred embodiment of the present invention.

The structure as shown in FIG. 4 is preferably exposed to an etchant to remove portions of the polysilicon layer 18, thereby forming the structure shown in FIG. 5 (step 206). This step is most preferably accomplished substantially simultaneously with the etching of the gate structures in the standard CMOS process flow. Thus, once again no additional steps are required to form these structures. As depicted in FIG. 6, the mask layer 28 is removed, and spacers 30 are formed, preferably by depositing, patterning, and etching a spacer material, such as a silicon oxide or nitride (step 208). The spacers 30 are most preferably formed substantially simultaneously with the spacers for the gates in the standard CMOS process flow. Thus, as before, no additional steps are required for the formation of the spacers 30.

Figure 7:
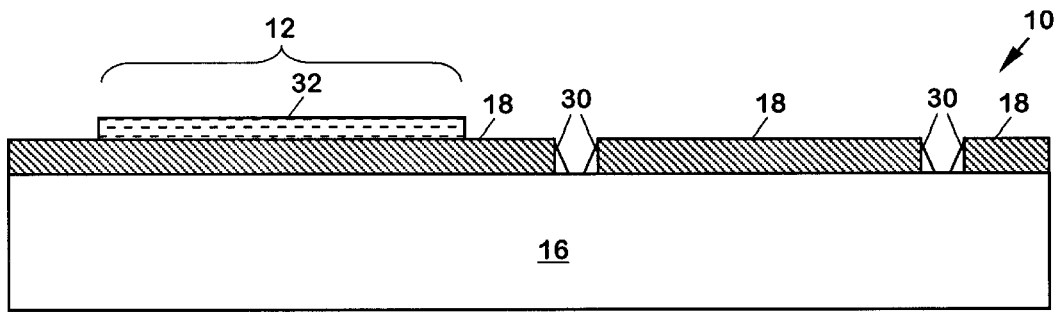
FIG. 7 depicts a masking step according to a preferred embodiment of the present invention.

As depicted in FIG. 7, a block oxide is deposited, patterned, and etched to form a block oxide layer 32 overlying and defining the first resistor segment 12 (step 210). Most preferably, the block oxide layer 32 is deposited, patterned, and etched substantially simultaneously with a block oxide layer that is used as a part of a standard CMOS process flow. Thus, as before, no additional processing steps are required for the formation of the block oxide layer 32.

The polysilicon layer 18 is preferably doped with electropositive material, such as by implanting boron ions, to form an electropositive region at least within the first segment 12 of the polysilicon layer 18 (step 212). The polysilicon layer 18 within the second segment 14 may also receive the electropositive doping, though it is not essential to the proper functioning of the resistor 10. In alternate embodiments an electronegative dopant is used. In either case, the dopant concentration is preferably selected in light of the considerations as described above. Further, the dopant is most preferably applied substantially simultaneously with a source drain implantation of a standard CMOS process flow, so that once again no additional processing steps are required for the doping of the polysilicon layer 18.

Figure 8:
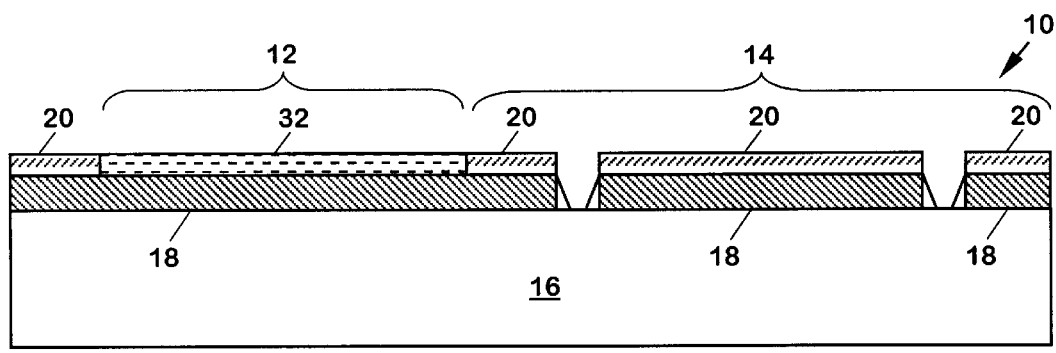
FIG. 8 depicts a silicidation step according to a preferred embodiment of the present invention.

The portions of the polysilicon layer 18 not covered by the block oxide layer 32 are exposed to the deposition of a metal halide, such as tungsten, titanium, or tantalum, in a silicidation process (step 214). Similar to that as explained above, this step is also performed substantially simultaneously with a metal deposition step that is accomplished as a part of a standard CMOS process flow, such as a precursor step for making silicide electrode contacts. As shown in FIG. 8, combining the metal halide with the exposed polysilicon layer 18 preferably forms the silicide layer 20 in the second segment 14 upon annealing of the layers, such as in a rapid thermal annealer. In this manner, the portion of the polysilicon layer 18 covered by the block oxide layer 32 comprises the unsilicided segment 12, and the portion of the polysilicon layer 18 not covered by the block oxide layer 32 comprises the silicided segment 14 of the resistor 10. Once again, the annealing step is accomplished as a part of a standard CMOS process flow, without an additional step required for the formation of the silicide 20.

Figure 9:
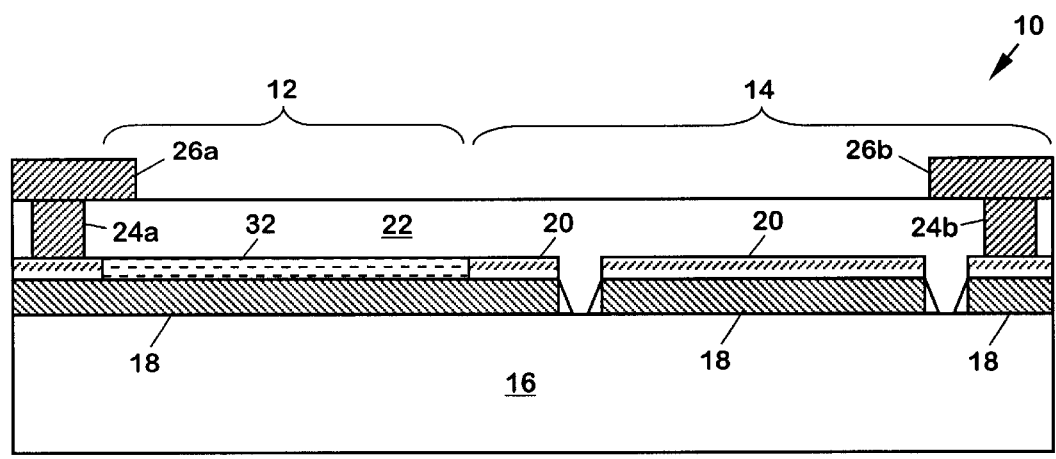
FIG. 9 depicts the formation of electrical conductors according to a preferred embodiment of the present invention.
Figure 10:
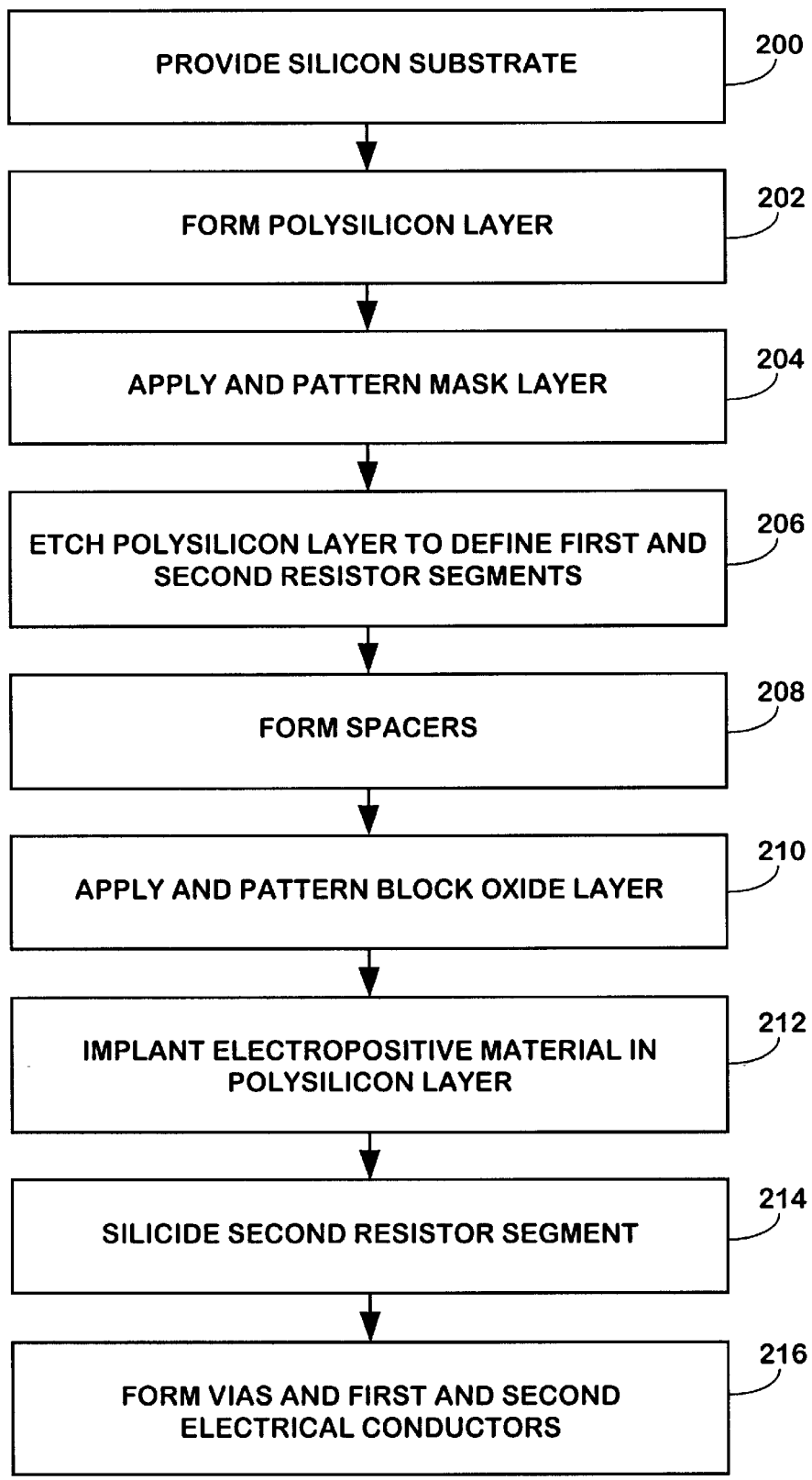
FIG. 10 is a flow chart depicting the steps of a method for fabricating a resistor according to a preferred embodiment of the present invention.

From this point forward, standard integrated circuit fabrication processes may be used to complete the structure depicted in FIG. 9, including forming the electrically insulating layer 22, which may be a low k layer, the vias 24a and 24b, and the conductors 26a and 26b (step 216), as well as other portions of an integrated circuit, which are not individually depicted in the figures for the sake of clarity. It is appreciated that certain steps of the method as described above do not necessarily need to be accomplished in the order as they are described, and that the invention is not limited to the exemplary order of process steps as given above.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A resistor having a desired temperature coefficient of resistance, comprising:
   a polysilicon layer having:
   a first unsilicided resistor segment having a first electrical resistance and a negative temperature coefficient of resistance, and
   a second silicided resistor segment having a second electrical resistance and a positive temperature coefficient of resistance, the second segment electrically connected in series with the first segment, where the second electrical resistance is related to the first electrical resistance according to:

$$\frac{R_1}{R_2} = \left|\frac{TCR_2}{TCR_1}\right|,$$

where $R_1$ is the first electrical resistance of the first resistor segment,
$R_2$ is the second electrical resistance of the second resistor segment.
$TCR_1$ is the negative temperature coefficient of resistance of the first resistor segment, and
$TCR_2$ is the positive temperature coefficient of resistance of the second resistor segment.

2. The resistor of claim 1 wherein the desired temperature coefficient of resistance is about zero.

3. The resistor of claim 1 wherein the first resistor segment is an unsilicided polysilicon resistor segment.

4. The resistor of claim 1 wherein the second resistor segment is a silicided polysilicon resistor segment.

5. The resistor of claim 1 wherein the second resistor segment is a polysilicon resistor segment that is silicided with a metal halide.

6. The resistor of claim 1 wherein at least one of the first resistor segment and the second resistor segment is substantially rectangular.

7. The resistor of claim 1 wherein at least one of the first resistor segment and the second resistor segment is substantially serpentine.

8. The resistor of claim 1 wherein the total electrical resistance $R_T$ is determined by:

$$R_T = R_2 \times \left(\left|\frac{TCR_2}{TCR_1}\right| + 1\right)$$

where $R_T$ is the total electrical resistor of the resistor,
$R_2$ is the second electrical resistance of the second resistor segment,
$TCR_1$ is the temperature coefficient of resistance of the first resistor segment, and
$TCR_2$ is the temperate coefficient of resistance of the second resistor segment.

9. The resistor of claim 1, wherein the resistor is formed as a part of a standard CMOS process flow for an integrated circuit.

10. An integrated circuit, the improvement comprising the resistor of claim 1.

* * * * *